(12) United States Patent
Lee

(10) Patent No.: US 8,648,451 B2
(45) Date of Patent: Feb. 11, 2014

(54) SEMICONDUCTOR PACKAGE, TEST SOCKET AND RELATED METHODS

(75) Inventor: Seok-Chan Lee, Hwaseong-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 273 days.

(21) Appl. No.: 13/088,576

(22) Filed: Apr. 18, 2011

(65) Prior Publication Data

US 2011/0260309 A1    Oct. 27, 2011

(30) Foreign Application Priority Data

Apr. 22, 2010    (KR) .................. 10-2010-0037541

(51) Int. Cl.
  *H01L 21/66*  (2006.01)
  *H01L 23/495*  (2006.01)

(52) U.S. Cl.
  USPC ............. 257/676; 257/E21.529; 257/E23.031

(58) Field of Classification Search
  USPC .......................... 257/676, E21.529, E23.031
  See application file for complete search history.

(56) References Cited

U.S. PATENT DOCUMENTS 6,803,650 B2 * 10/2004 Crane et al. .................. 257/697

FOREIGN PATENT DOCUMENTS

| JP | 11-017058 A | 1/1999 |
|---|---|---|
| KR | 20-1999-0038759 U | 10/1999 |
| KR | 20-0287947 U | 8/2002 |

* cited by examiner

*Primary Examiner* — Matthew W Such
*Assistant Examiner* — Monica D Harrison
(74) *Attorney, Agent, or Firm* — Muir Patent Consulting, PLLC

(57) ABSTRACT

Provided are a socket, a semiconductor package, a test device and a method of manufacturing a semiconductor package. A socket to test a semiconductor package comprising a housing, a trench receiving a semiconductor package in the housing, at least one probe connected to the semiconductor package at a bottom of the trench, and at least one connector electrically connecting a plurality of contact points exposed at a side of the semiconductor package when the semiconductor package is inserted into the trench. A semiconductor package with contacts exposed from a side of a package substrate, and a method of manufacturing such a semiconductor package are also disclosed.

16 Claims, 10 Drawing Sheets

SEMICONDUCTOR PACKAGE, TEST SOCKET AND RELATED METHODS

CROSS-REFERENCE TO RELATED APPLICATIONS

This U.S. non-provisional patent application claims priority under 35 U.S.C. §119 of Korean Patent Application No. 10-2010-0037541, filed on Apr. 22, 2010, the entire contents of which are hereby incorporated by reference.

BACKGROUND

A semiconductor package protects a semiconductor chip comprising at least one semiconductor element from external environments such as impact or vibration. Additionally, the semiconductor package has a structure through which power and signals are inputted or outputted between the external and a semiconductor chip. The semiconductor package is inserted into a test socket of a test device to perform a test operation.

SUMMARY

The disclosed embodiments provide a semiconductor package ensuring reliability of test operations. Furthermore, the disclosed embodiments provide a method of manufacturing a semiconductor package. Also, disclosed embodiments include a test socket device and method used to test a semiconductor package.

According to one embodiment, a test socket includes a housing, a trench for receiving the semiconductor package in the housing, at least one probe connected to the semiconductor package at a bottom of the trench, and a connection element electrically connecting a plurality of contact points exposed at a side of the semiconductor package when the semiconductor package is inserted into the trench.

In another embodiment, the connection element may comprise a connector at a sidewall of the trench.

In another embodiment, the connection element may protrude from the housing at the sidewall of the trench.

In still another embodiment, the connection element may comprise at least one of a vertical connector vertical to the bottom of the trench, a parallel connector parallel to the bottom of the trench, and an inclined connector inclined to the bottom of the trench.

In another embodiment, the vertical connector may comprise at least one of a blade or a pin.

In yet another embodiment, the connector may comprise a metal bar connected between the vertical connectors with respectively different levels.

In another embodiment, the connector may have an inclined plane tilted with respect to a direction of insertion of the semiconductor package into the test socket.

In another embodiment, a semiconductor package includes a semiconductor chip, a package substrate supporting the semiconductor chip, a plurality of pads at the bottom of the substrate, and first and second interconnections electrically connected to the semiconductor chip and at least one of the plurality of pads, respectively, at upper and lower portions of the package substrate and exposed to a side of the substrate.

In another embodiment, first and second interconnections may comprise a first contact point and a second contact point, respectively, the first and second contact points being exposed with respect to a side or sides of the substrate.

In another embodiment, a plurality of pads may comprise non-connection pads, the non-connection pads being electrically connected to the semiconductor chip through a connector that connects the first contact point of the first interconnection with the second contact point of the second interconnection during a test.

In another embodiment, the non-connection pads may be disposed at an edge of the substrate.

In another embodiment, a method of manufacturing a semiconductor package includes assembly of a semiconductor package, such as one disclosed herein. The method may further comprise testing the semiconductor package or defects of the package, and/or defects of one or more semiconductor chips protected by and/or within the package. Such testing may use a test socket, such as test socket disclosed herein.

In another embodiment, a method of manufacturing may comprise testing for defects of a semiconductor package and/or defects of one or more semiconductor chips protected by and/or within the package.

In another embodiment, a method of manufacturing may further comprise adding a protective element to exposed contacts on a side of the packaging.

In another embodiment, a method of manufacturing may further comprise combining the tested semiconductor package with additional semiconductor chips, such as stacking additional semiconductor chips, or additional semiconductor packages including one or more additional semiconductor chips. One or more chips of the tested semiconductor package may be in communication with the one or more additional semiconductor chips. Such combination may comprise a package on package assembly operation.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
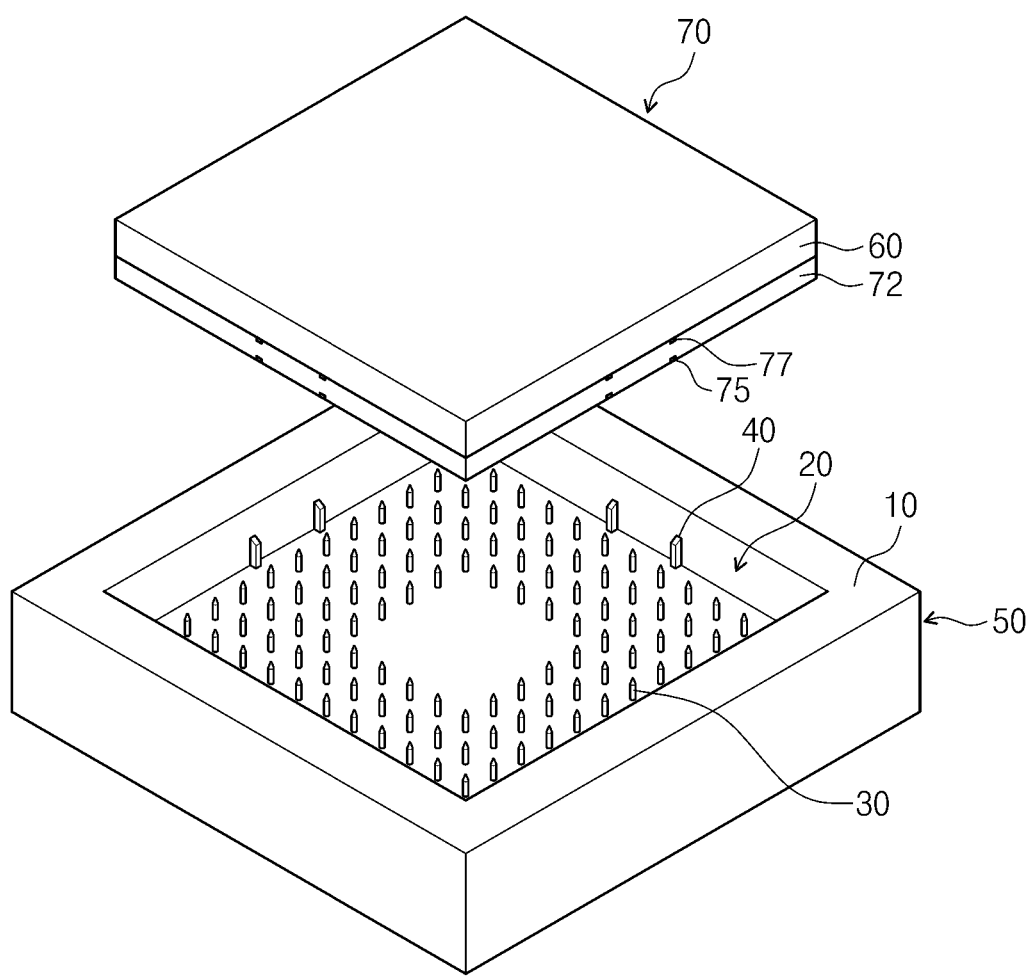
FIG. 1 is a perspective view of, and FIGS. 2 and 3 are sectional views of a semiconductor package and a test socket thereof according to an exemplary embodiment.

Exemplary embodiments of the inventive concept will now be described more fully with reference to the accompanying drawings in which some example embodiments are shown.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two steps or figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Additionally, the embodiment in the detailed description will be described with sectional views as ideal exemplary views of the disclosed embodiments. Accordingly, shapes of the exemplary views may be modified according to manufacturing techniques and/or allowable errors. Therefore, the embodiments are not limited to the specific shape illustrated in the exemplary views, but may comprise other shapes that may be created according to manufacturing processes. Areas exemplified in the drawings have general properties, and are used to illustrate a specific shape of a semiconductor package region. Thus, this should not be construed as limited to the scope of the inventive concept.

Figure 2:
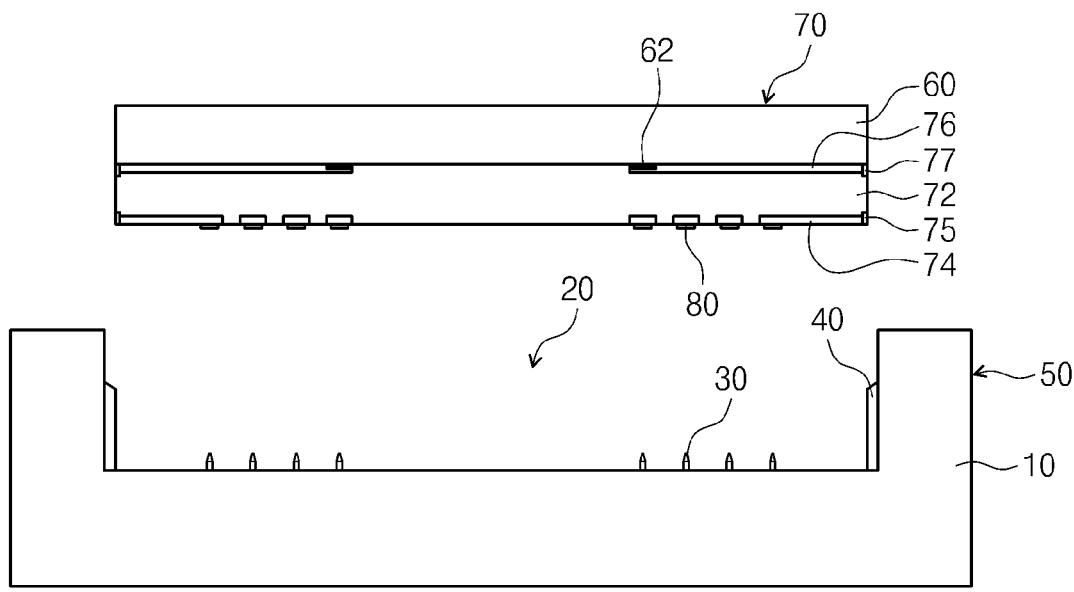
Figure 3:
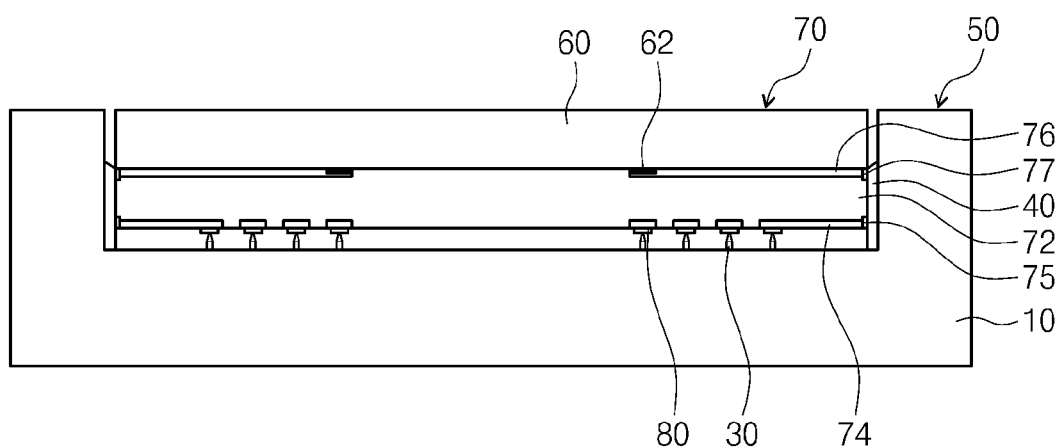

FIGS. 1 through 3 are a perspective view and sectional views of a semiconductor package, semiconductor chip and a test socket according to an exemplary embodiment Referring to FIGS. 1 through 3, the test socket 50 for testing the semiconductor package 70 (including a semiconductor chip 60 and package substrate 72), comprises a housing 10 with a trench 20, a plurality of probes 30, and at least one connector 40 connecting a first contact point 75 and a second contact point 77 exposed on the side of the semiconductor package 70 at the sidewall of the trench 20. The connector 40 may connect the first contact point 75 with the second contact point 77 when the semiconductor package 70 is inserted into the trench 20. When the semiconductor package 70 is inserted into trench 20, the first contact point 75 of the semiconductor package 70 may contact an end of a first interconnection 74 at the bottom of the package substrate 72 and the second contact point 77 may contact an end of a second interconnection 76 at the top of the package substrate 72. The first interconnection 74 may be connected to a plurality of probes 30 at the bottom of the trench 20 through pads 80 at the bottom of the package substrate 72 when the package 70 is inserted into trench 20. And, the second interconnection 76 may be connected to a semiconductor chip 60 through a bump 62 at the end of the second interconnection 76 on the top of the package substrate 72.

The test socket 50 of the semiconductor package 70 according to the disclosed embodiments may be used to perform a test on the semiconductor chip 60.

The housing 10 may align and fix the plurality of probes 30. Additionally, the housing 10 may temporarily fix the semiconductor package 70 to be connected to the plurality of probes 30. The housing 10 may protect the semiconductor package 70 from the external environment. The housing 10 may have various forms into which the semiconductor package 70 is inserted. For example, the housing 10 may comprise the trench 20 into which the semiconductor package 70 is inserted. Although not illustrated in the drawings, the housing 10 may further comprise a lid covering the semiconductor package 70 inserted into the trench 20.

The trench 20 may guide the semiconductor package 70 in the housing 10. In more detail, the trench 20 may guide the pads 80 of the semiconductor package 70 to the probes 30. Widths of trench 20 may be respectively formed broader than the widths of the semiconductor package 70. The trench 20 may have the bottom surface parallel to the bottom surface of the semiconductor package 70 (when inserted). The plurality of probes 30 may be located at the bottom of the trench 20. The plurality of probes 30 may be arranged in a one to one correspondence to the pads 80 at the bottom of the semiconductor package 70. A plurality of interconnections (not shown) connected to the probes 30 may extend from the probes inside of the housing 10. These interconnections may each have a unique connection to one of the probes 30. Alternatively, one or more of these interconnections may connect to multiple ones of probes 30. Additionally, the plurality of interconnections may be connected to a test device (not shown).

As mentioned above, the connector 40 connecting the first contact point 75 with the second contact point 77 that are exposed at the side of the semiconductor package 70, may be disposed at the sidewall of the trench 20. The connector 40 connects the first contact point 75 and the second contact point 77 of the semiconductor package 70 when it is inserted into the trench 20. That is, the connector 40 electrically connects the second interconnection 76 with the first interconnection 74 through the first and second contact points 75 and 77 only when the semiconductor package 70 is inserted into the trench 20. The connector 40 may protrude from the sidewall of the trench 20. There may be a plurality of connectors 40. The distance between the plurality of connectors 40 facing each other in the trench 20 may be identical to or less than the width of the semiconductor package 70. The connector 40 may have an inclined plane tilted with respect to a direction that the semiconductor package is inserted. The connectors 40 may be composed of a metal such as copper, aluminum, iron, and tungsten, which electrically connect the first contact point 75 with the second contact point 77.

The connectors 40 may be disposed in a vertical, parallel, or an inclined direction according to the arrangement of the first and second contact points 75 and 77 in the semiconductor package 70. Exemplary vertical connectors 42 and 44, exemplary parallel connectors 46, and exemplary inclined connectors 48 are shown in FIGS. 4A and 4B, FIGS. 5A and 5B, and FIGS. 6A and 6B, respectively. Additionally, the first and second contact points 75 and 77 contacting the connectors 40 may be disposed as shown in FIGS. 7A through 7C.

Figure 4A:
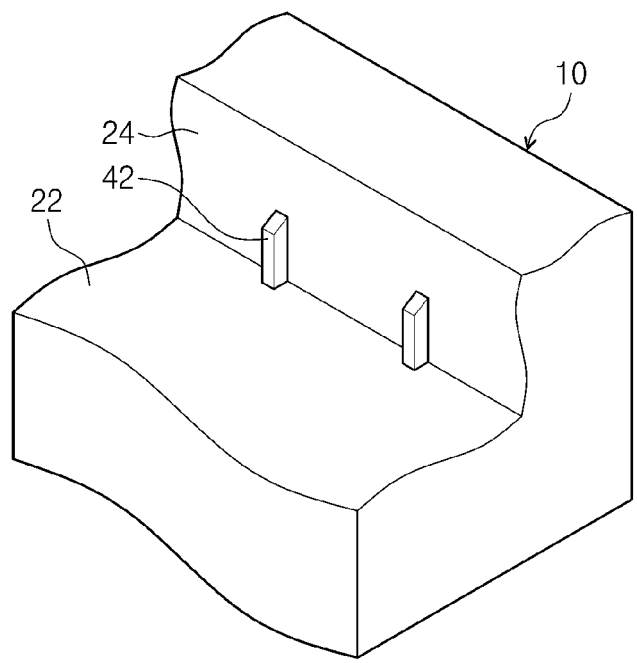
FIGS. 4A and 4B are perspective views of vertical connectors.
Figure 4B:
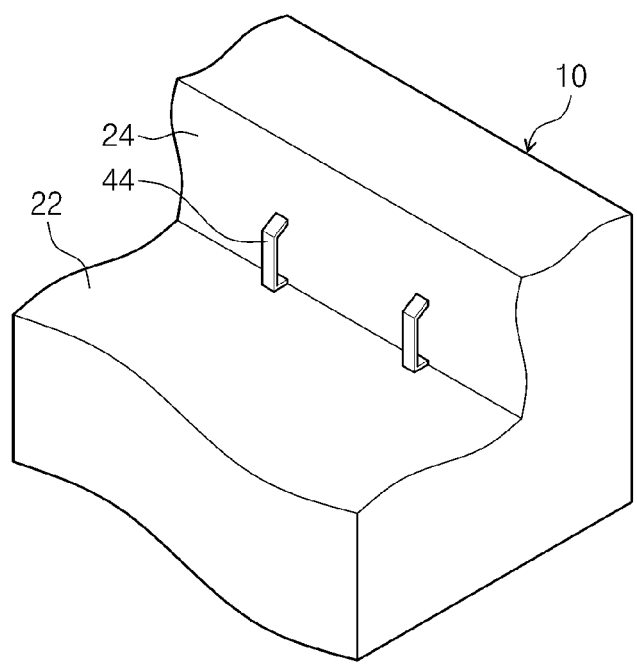

FIGS. 4A and 4B are perspective views of the vertical connectors 42 and 44. The vertical connectors 42 and 44 may be disposed in a direction vertical to the bottom 22 of the trench 20. The vertical connector of housing 10 may comprise all blade connectors 42, all pin connectors 44 or a combination of blade and pin connectors. The blade connectors 42 may be fixed to the housing 10 at the sidewall 24 of the trench 20. The entire length of the blade connectors 42 may be attached to sidewall 24 of the housing 10. The blade connector 42 may extend to the bottom 22 of the trench 20. Accordingly, the blade connectors 42 may connect the first contact point 75 with the second contact point 77, which are exposed vertically at the side of the semiconductor package 70. The pin connectors 44 may be bent according to a position of the semiconductor package 70. Both ends of the pin connectors 44 may extend from and be supported by the sidewall 24. Alternatively, or in addition, the bottom of pin connector 44 may extend from either the sidewall 24 or bottom 22 and be supported by bottom 22 of the trench 20 of the housing 10. The pin connectors 44 may have an elasticity that allows pin connectors 44 to bend toward the sidewall 24 of the trench 20 in the housing 10 when the semiconductor package 70 is inserted in the housing 10. Therefore, the pin connectors 44 may connect the first contact point 75 with the second contact point 77, which are arranged vertically, at the side of the semiconductor package 70 as shown in FIG. 7A.

Figure 5A:
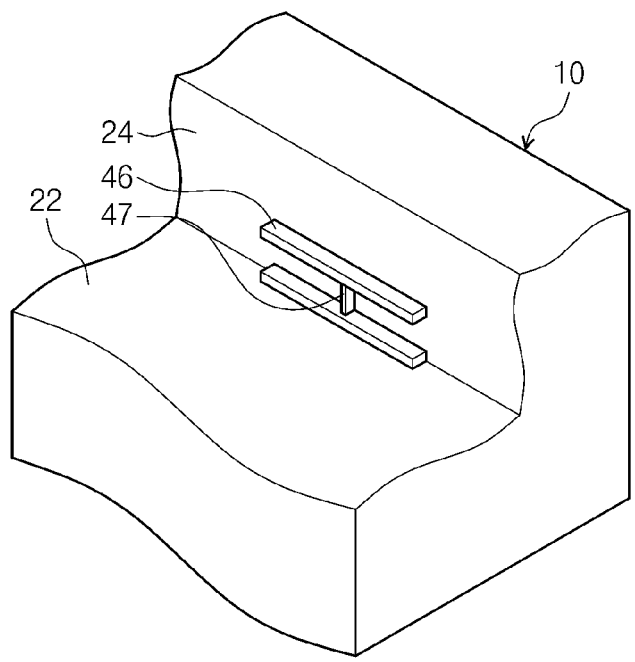
FIGS. 5A and 5B are perspective views illustrating parallel connectors.
Figure 5B:
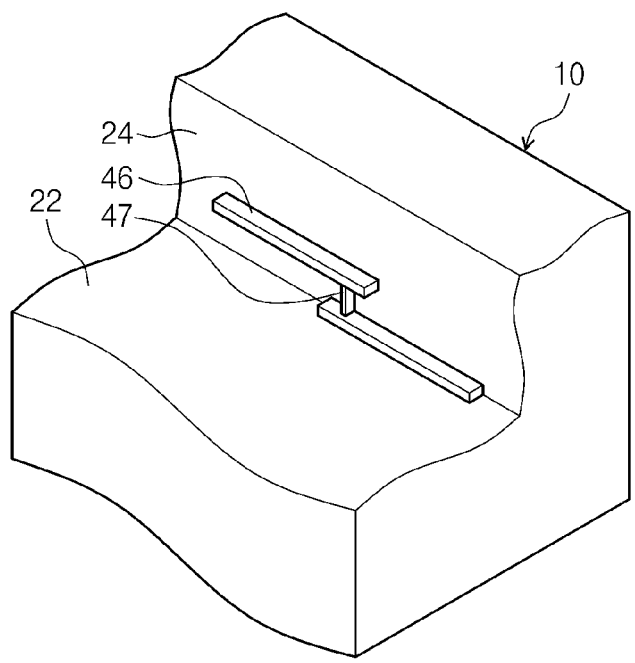

FIGS. 5A and 5B are perspective views illustrating the parallel connectors 46. The parallel connectors 46 may be disposed in a direction parallel to the bottom 22 of the trench 20. The parallel connectors 46 may have a rounded edge to contact the first contact point 75 and the second contact point 77. The parallel connectors 46 may electrically connect the first contact point 75 with the second contact point 77 of the same level as shown in FIG. 7B. Furthermore, the parallel connectors 46 may electrically connect a plurality of first contact points 75 to a plurality of second contact points 77 at the same level. For example, a plurality of parallel connectors 46 of respectively different levels may be aligned in a vertical direction or may be disposed overlapping each other. While only two parallel connectors 46 are shown in FIGS. 5A and 5B, three or more parallel connectors 46 are also contemplated. Additionally, a plurality of parallel connectors 46 of respectively different levels may be electrically connected to each other by a metal bar 47. The plurality of parallel connectors 46 may respectively contact the first and second contact points 75 and 77 disposed in a vertical direction or an inclined direction as shown in FIG. 7A or 7C. The metal bar 47 between the plurality of parallel connectors 46 may connect the first contact point 75 with the second contact point 77 disposed in a vertical direction or an inclined direction as shown in FIG. 7A or 7C.

Figure 6A:
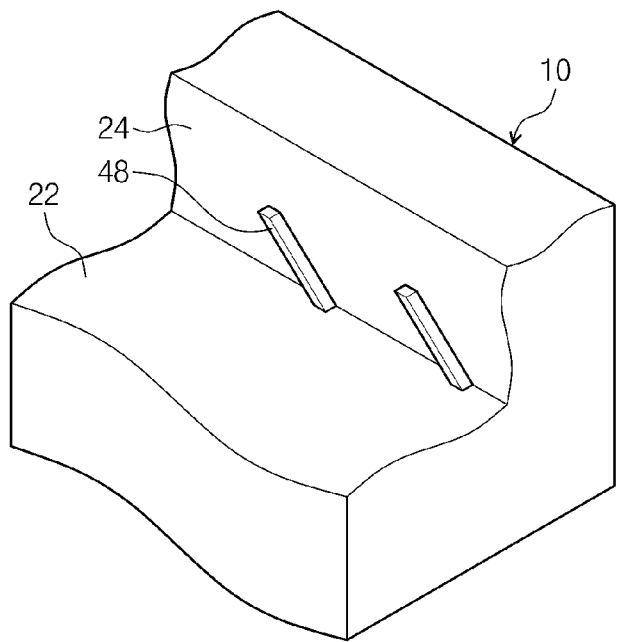
FIGS. 6A and 6B are perspective views illustrating inclined connectors.
Figure 6B:
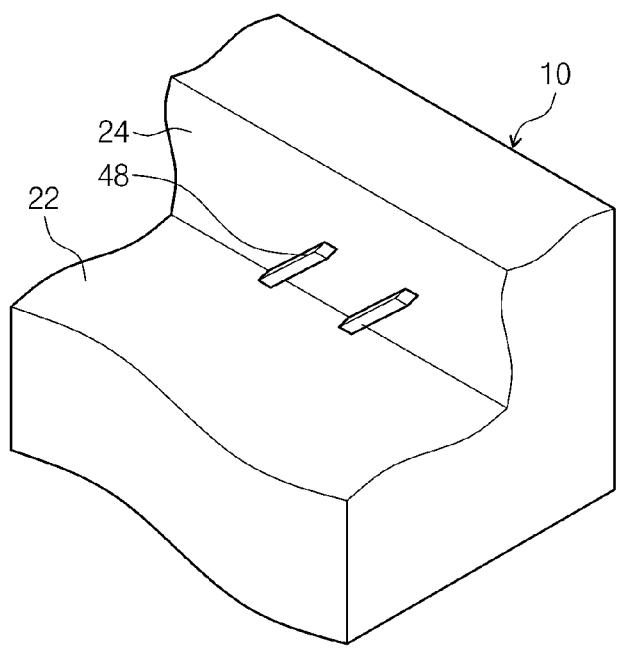
Figure 7A:
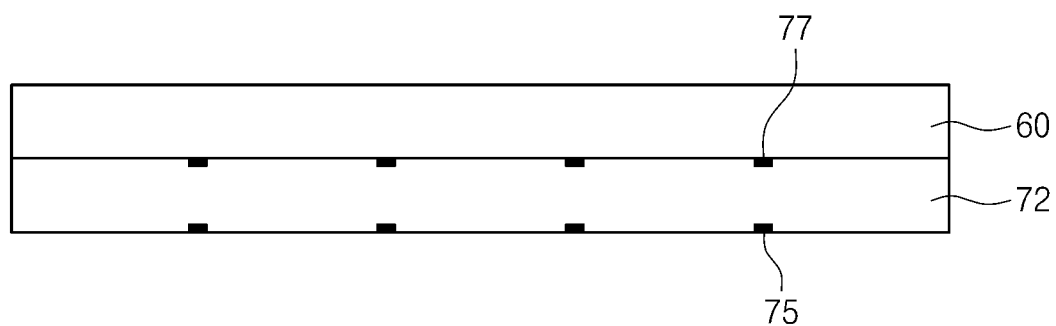
FIGS. 7A through 7C are sectional views illustrating positions of a first contact point and a second contact point in a package substrate.
Figure 7B:
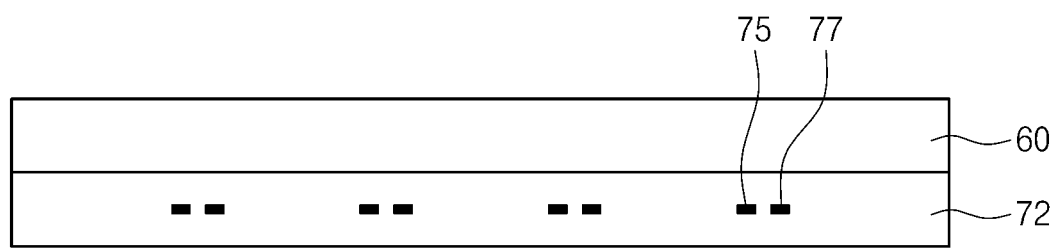
Figure 7C:
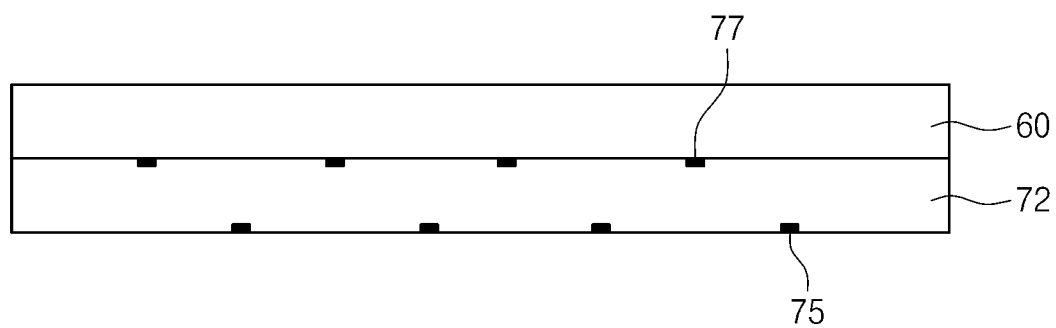

FIGS. 6A and 6B are perspective views illustrating inclined connectors 48. The inclined connectors 48 may be disposed in an inclined direction tilted at a predetermined angle with respect to the bottom 22 of the trench 20. The inclined connectors 48 may connect the first contact point 75 with the second contact point 77 disposed in an inclined direction with respect to the bottom 22 of the trench 20 as shown in FIG. 7C. Accordingly, the inclined connectors 48 may electrically connect the first connect point 75 with the second contact point 77 disposed diagonally at respectively different levels. While the examples of FIGS. 5A, 5B, 6A and 6B show connectors having an entire length in contact with sidewall 24 of trench 20, the connectors may protrude from sidewalls 24, which may be similar to the example of FIG. 4B.

The test socket 50 of the semiconductor package 70 according to the disclosed embodiments may improve test reliability of the semiconductor package 70 using the connectors 40 that connect the first contact point 75 with the second contact point 77 exposed at the side of the semiconductor package 70.

The test socket 50 of the semiconductor package 70 was described with reference to FIGS. 1 through 6B to illustrate the technical scope of the disclosed embodiment. That is, the test socket 50 of the semiconductor package 70 according to the disclosed embodiments may be applied as it is or modified based on consideration of the corresponding semiconductor package 70.

Figure 8:
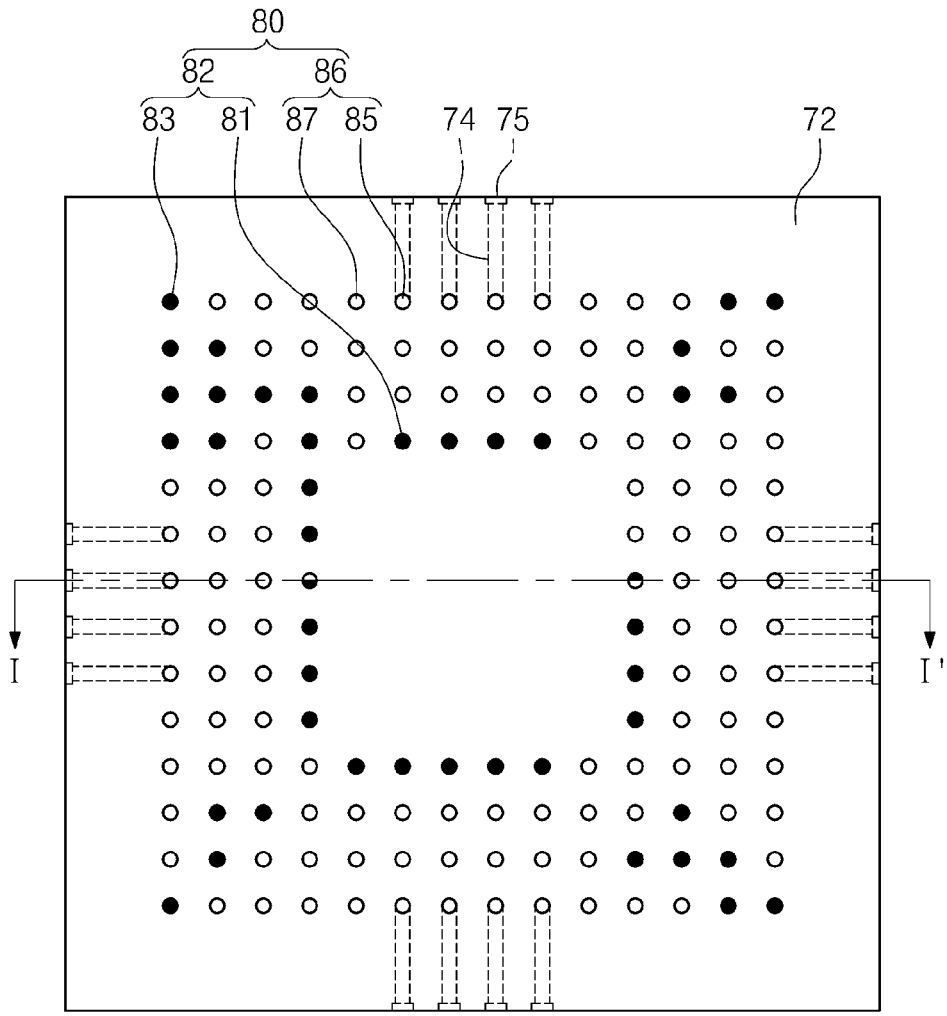
FIG. 8 is a plan view illustrating a package substrate and pads.
Figure 9:
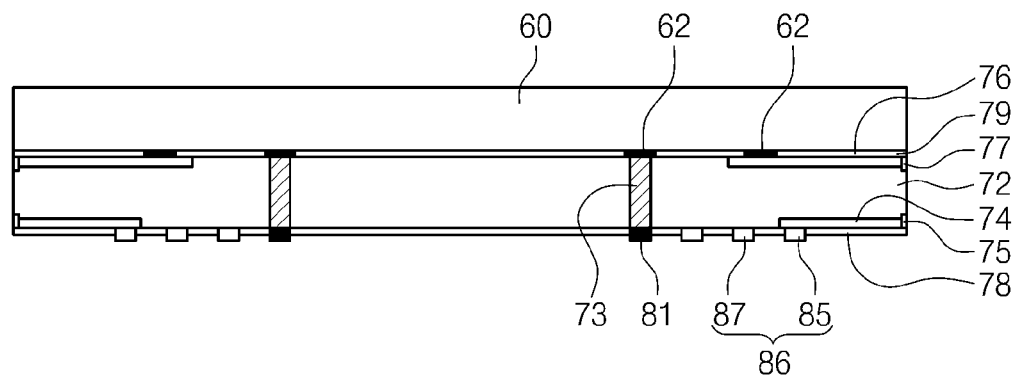
FIG. 9 is a sectional view taken along the line I-I' of FIG. 8.

FIG. 8 is a plane view illustrating a package substrate 72 and pads 80. FIG. 9 is a sectional view taken along the line I-I' of FIG. 8.

Referring to FIGS. 8 and 9, the semiconductor package 70 comprises a plurality of pads 80 in a symmetric position with respect to the center of the bottom of a package substrate 72. The plurality of pads 80 may be disposed at predetermined intervals. The plurality of pads 80 comprises connection pads 82 that are electrically connected to the semiconductor chip 60 and non-connection pads 86 that are not electrically connected to the semiconductor chip 60. The non-connection pads 86 of the semiconductor chip 60 may be used during testing of the chip to provide signal communications with semiconductor chip 60, but are not used for normal operation. The semiconductor package 70 may lack electrical connections between all or some of the non-connection pads and terminals, such as chip pads, of the semiconductor chip 60.

The connection pads 82 may be electrically connected to the semiconductor chip through a via electrode 73 penetrating the package substrate 72 and a bump 62. FIG. 9 illustrates a connection pad 81, a via electrode 73, and a bump 62 all in vertical alignment. However, it is understood that a redistribution wiring at or above a top of via electrode 73, or at or below a bottom of via electrode 73 may be used to allow for a design that does not require vertical alignment of all or some of the connection pads 82, via electrode 73 and bump 62. In addition, all or some of the non-connection pads 86 may be separately disposed only at the bottom of the package substrate 72, without being connected to the semiconductor chip 60. The non-connection pads 86 may be arbitrarily designed according to a design having a symmetric structure of a product. For example, 20% to 30% of the pads 80 may be connection pads 82, while the remaining pads are non-connection pads. In one implementation of the example illustrated in FIG. 8, there are about 160 pads 80 in the package substrate 72. Among them, about 44 are the connection pads 82 and the remaining 116 are the non-connection pads 86. As another example, 15% to 50% of the pads 80 may be connection pads 82, while the remaining pads are non-connection pads. As another example, the number of connection pads 82 may be less than 60%, less than 40% or less than 25% and the remainder of pads may be non-connection pads.

The connection pads 82 comprise signal connection pads 83 to transmit various signals to or from the semiconductor chip 60. These signals may include one or more of data signals, address signals and control signals. Some of signal connection pads 83 may be dedicated to data signals, others to address signals, and others to control signals (e.g., may be data pads, address pads or control pads) to provide signal communications to buffers within semiconductor chip 60, such as a data I/O buffer, an address buffer and a control buffer, respectively. Alternatively, some or all of signal connection pads 83 may be used to transmit multiple ones of data, address and control signals (e.g., pads for both data and address signals, pads used for both address and control signals, etc.). Connection pads 82 also comprise power connection pads 81 inputting power to the semiconductor chip 60. Such power pads may include pads for supplying Vdd, Vss, and/or ground voltage supplies. The power connection pads 81 may be disposed away from the signal connection pads 83. The power connection pads 81 may be mainly disposed on the center of the package substrate 72. If the signal connection pads 83 are near the power connection pads 81, poor signal processing of the signal connection pads 83 may occur due to noise. Therefore, the power connection pads 81 may be disposed adjacent to the non-connection pads 86. For example, non-connection pads may be disposed between power connection pads 81 and signal connection pads 83. The design of the package may also contemplate that no signal connection pad 83 is disposed as an immediate neighbor of a power connection pad 81. In this case, at any signal connection pad 83 would be disposed more than one pitch length (e.g., two or more pitch lengths) from any power connection pad 81, where such pitch length refers to the pitch of the pad spacing. The areas between the power connection pads 81 and signal connection pads may be populated with non-connection pads 86 or may be depopulated (such as shown in the center of FIG. 8).

The non-connection pads 86 may be disposed adjacent to the power connection pads 81 and the signal connection pads 83. Some of the non-connection pads 86 adjacent to the power connection pads 81 may be connected to a first interconnection 74 having a first contact point 75 connected to connectors 40 of a test socket 50 during a test of the semiconductor chip 60. The non-connection pads 86 which are connected to a first interconnection 74 are labeled as non-connection pads 86. There may be 16 or more, or 32 or more, or 16 to 20 of the non-connection pads 86 (connected to the first interconnection 74). All of these non-connection pads 86 may be connected to a first interconnection 74 unique to the non-connection pad 86. Alternatively, all or some of these non-connection pads 86 may be connected to a first interconnection 74 which is shared with one or more others of the non-connection pads 86. The non-connection pads 86 connected to the first interconnection 74 may be selectively connected to the semiconductor chip 60 during a test. The non-connection pads 86 may comprise non-connection pads 87 which are not connected to a first interconnection 74. For example, the non-connection pads 87 may not be connected to any other conductive element on or within the package substrate 72. Optionally, non-connection pads 87 be connected to a bump (such as a solder ball) in a manner similar to bump connections to pads 82. The pads 87 may be electrically floating (whether or not they are connected to other conductive elements, such as a solder bump).

The non-connection pads 85 may be electrically connected to the semiconductor chip 60 when the semiconductor package 70 is loaded in the test socket 50. The non-connection pads 85 may be disposed close to the side of the package substrate 72, such as along an outer periphery of the pad array formed by pads 80. The non-connection pads 85 may contact probes 30 during a test. During a test, the non-connection pads 85 may be electrically separate from the connection pads 82 and have separate test signals applied thereto.

Additionally, the non-connection pads 85 may support an operational reliability of the semiconductor chip 60 and/or semiconductor package 70. The non-connection pads 85 may not generate electrical limitations even if a short circuit occurs between a connection pad 82 and one or more of the non-connection pads 86, such as a non-connection pad 85, and one of connection pads 82. The reason is that the non-connection pads 85 are electrically separated at the first contact point 75 of the first interconnection 74. For example, an electrical node including a non-connection pad 85 and a corresponding first interconnection 74 connected thereto, may be electrically floating after testing (e.g., during normal use after removal from housing 10). While the second interconnection 76 may be connected to test pads of semiconductor chip 60, such as pad 82, second contact point 77 may not have a design for a package connection similar to pads 80. That is, pads 80 may all have a similar design, such as a pad for mounting a bump, such as a solder ball or solder pillar, whereas second contact point 77 may have a smaller contact area designed for contact only during testing. In addition, after testing, contact points 75 and/or 77 may be covered by an insulator, such as a resin packaging material to prevent unwanted electrical contact from an external source. Such resin packaging material may be part of a pack-on-package (POP) packaging step where package 70 is stacked with one or more other packages. Such stack of packages may have a further encapsulation step which may include covering contact points 75 and/or 77. Alternatively, one or both of contact points 75 and 77 may be left exposed to the atmosphere, during and/or after mounting the semiconductor package 70 to a printed circuit board as part of a larger system assembly (e.g., as part of a PC motherboard, or board in a handset, PDA, or a portable electronic device such as a music player).

The first interconnection 74 may be disposed in or on a bottom of the package substrate 72. The first interconnection 74 may be electrically connected to the non-connection pads 86 at the bottom of the package substrate 72. Additionally, a second interconnection 76 may be disposed on the package substrate 72 facing the first interconnection 74. The second interconnection 76 may comprise a second contact point 77 exposed to the side of the package substrate 72. The second interconnection 76 may be connected to a bump 62 between the package substrate 72 and the semiconductor chip 60. The second interconnection 76 may comprise an upper pattern disconnected at the second contact point 77 disposed at the side of the package substrate 72.

The first and second interconnections 74 and 76 may be disposed in the package substrate 72. The first and second interconnections 74 and 76 may be electrically connected through a via electrode 73. The via electrode 73 may be through the package substrate 72. The first contact point 75 and the second contact point 77 may be spaced apart from each other at the side of the package substrate 72. Furthermore, the first and second interconnections 74 and 76 may be structured in different patterns within the top and bottom of the package substrate 72. The first and second interconnections 74 and 76 may be protected from the external environment by an upper coating layer 79 and a lower coating layer 78, respectively. The first contact point 75 and the second contact point 77 may be exposed with respect to the upper coating layer 79 and the lower coating layer 78, respectively, at the side of the package substrate 72.

The package substrate 72 may have an area identical to or larger than that of the semiconductor chip 60. If the package substrate 72 has a larger area than the semiconductor chip 60, the semiconductor chip 60 may be covered by a mold resin to approximately match the area of the package substrate 72. The package substrate 72 may comprise a single layer structure or a multi-layer structure. For example, the package substrate 72 may comprise a printed circuit board (PCB) formed of a resin component. The package substrate 72 may comprise a via electrode 73 between a bump 62 and the connection pads 82. The first contact point 75 and the second contact point 77 may be exposed with respect to the package substrate 72 where the first interconnection 74 and the second interconnection 76 are disconnected, at the side of the package substrate 72. The first contact point 75 and the second contact point 77 may be electrically connected by the connectors 40 of the test socket 50 during an electrical test of the semiconductor chip 60.

Accordingly, the semiconductor package 70 according to the disclosed embodiments comprises the non-connection pads 85 that are selectively connected during a test through the first contact point 75 and the second contact point 77 exposed to the side of the package substrate, such that test reliability may be guaranteed.

The first contact point 75 and the second contact point 77 may be disposed in a direction (refer to FIG. 7A) vertical to the package substrate 72, a direction (refer to FIG. 7B) parallel to the package substrate 72, or a direction (refer to FIG. 7C) inclined to the package substrate 72. The first contact point 75 and the second contact point 77 may be electrically connected in a testing socket by the vertical connectors 42 and 44, the parallel connectors 46, or the inclined connectors 48.

As a result, the semiconductor package 70 and its test socket 50 according to the disclosed embodiments connect the first contact point 75 with the second contact point 77 (exposed to the side of the package substrate 72) using the connectors 40 to conduct a test.

Moreover, a plurality of pads comprising switching non-contact pads are designed in a simple form such that a consumer's demand may be satisfied.

Figure 10:
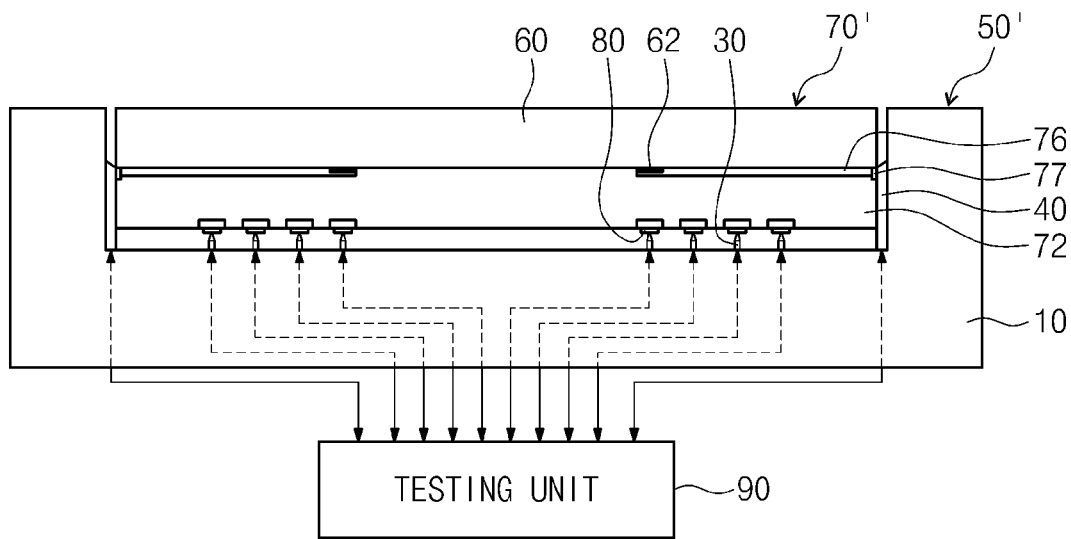
FIGS. 10 and 11 illustrate alternative embodiments.
Figure 11:
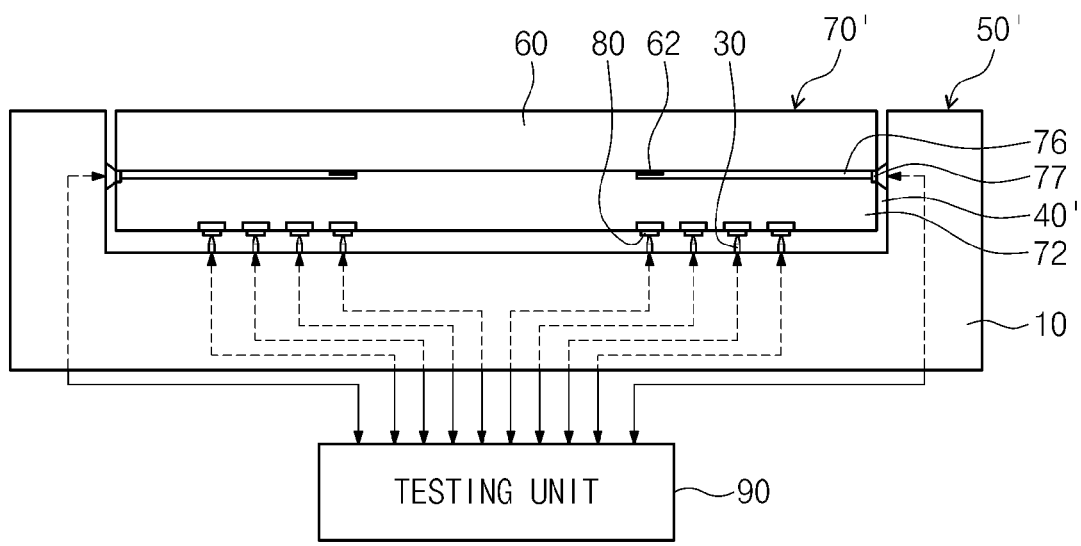

FIGS. 10 and 11 illustrate alternative embodiments. FIGS. 10 and 11 illustrate an example with a test socket 50' similar to that of FIG. 3 and reference numbers shared between FIGS. 10/11 and FIG. 3 indicate the structure may be the same, and thus detailed description is not repeated here. In the embodiment of FIG. 10 package 70' may not include first contact point 75 exposed from the side of package 70' and first interconnection 74 connecting contact point 75 to a package pad 80. To connect second contact point 77 to a testing unit, electrical connections within test socket 50 provide a direct signal path from connector 40 to the testing unit 90 (including the dashed lines in FIG. 10). The testing unit may communicate with N.C. pads of semiconductor chip 60 (such as a N.C. chip pad connected to bump 62) via electrical connections within the test socket 50', connector 40 in contact with contact point 77, interconnection 76 and bump 62.

FIG. 11 illustrates yet another alternative embodiment. The example of FIG. 11 is the same as that of FIG. 10 with a modification to connector 40. In FIG. 11, connector 40' is shorter than connector 40 of FIG. 10, such that it does not extend to the bottom of trench 20. Testing unit 90 connects to N.C. pads of semiconductor chip 60 via a wiring or other electrical connection within test socket 50' which connects to connector 40' at a side of trench 20. Connector 40' may be fixed. Alternatively, connector 40' may be moveable in a lateral direction to move into contact with contact point 77 after package 70' has been inserted into test socket 50'.

Figure 12:
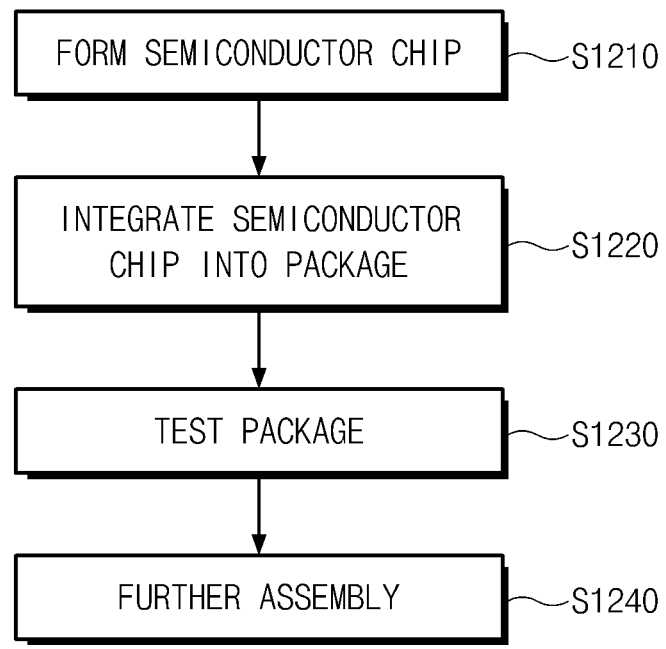
FIG. 12 is a flowchart of a method.

FIG. 12 illustrates an exemplary method of manufacturing a semiconductor package having one or more semiconductor chips packaged therein. In step S1210, at least one semiconductor chip is formed. The semiconductor chip may include an integrated circuit formed therein with pads in communication with the integrated circuit. The semiconductor chip circuit may include an address buffer, a data buffer and/or a command buffer. The semiconductor chip circuit may include a voltage regulator or internal voltage generator. The semiconductor chip may include signal pads formed on an exterior surface to provide signal connections to the address buffer, data buffer and/or command buffer. The semiconductor chip may have power pads formed on an exterior surface, such as Vdd and/or Vss, connected to the voltage regulator and/or the internal voltage generator. The semiconductor chip may include N.C. pads. These N.C. pads may be used only during a testing of the semiconductor chip and/or a semiconductor package housing the semiconductor chip. The semiconductor chip fabricated within the semiconductor package may include features of one or more of the embodiments disclosed herein for testing the semiconductor chip. In step S1220, the semiconductor chip is integrated into a semiconductor package. Signal pads of the semiconductor chip may be electrically connected to corresponding ones of signal terminals of the package, e.g., through a wiring on a package substrate. Power pads of the semiconductor chip may be electrically connected to corresponding ones of power terminals of the package, e.g., through a wiring on a package substrate. The package may also include N.C. terminals. Some or all of the N.C. terminals of the package may be connected to N.C. pads of the semiconductor chip. Some of the N.C. pads of the semiconductor chip may be connected by wiring of the package substrate to contacts of the semiconductor substrate, the contacts being exposed at a side of the semiconductor package (e.g., as described with respect to contacts 77 of any of the embodiments described herein, or some other manner). In step S1230, the package is tested. The testing of the package may include insertion of the package into a testing socket, such as a housing with a trench in accordance with any of the embodiments described herein. The testing may include connecting a testing unit to the contacts exposed at the side of the package to communicate with the N.C. pads of the semiconductor chip that are electrically connected to the contacts through the wiring of the semiconductor package. The connection of the testing unit to the contacts exposed at the side of the package may be done in accordance with any of the embodiments described herein. The semiconductor package may be left unmodified after testing, or may have some modification (such as programming for a certain operating speed) in response to the testing. Alternatively, the testing may result in determining the package and/or chip therein is defective in which case it may be desirable to discard the package. The method may end at step S1230. Optionally, the method may further comprise step S1240. In step S1240, the method of manufacturing a semiconductor package may also include further assembly, such as stacking the tested semiconductor package with another semiconductor package and/or mounting the semiconductor package on a printed circuit board.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A socket adapted to removably receive and test a semiconductor package, the socket comprising:
   a housing having a trench defined therein to removably receive a semiconductor package;
   at least one probe extending from a bottom of the trench, adapted to be connected to the semiconductor package; and
   at least one connector on a sidewall of the trench electrically adapted to connect at least one contact exposed at a side of the semiconductor package to a testing unit when the semiconductor package is inserted into the trench,
   wherein the connector comprises a plurality of parallel connectors extending in a horizontal direction with respect to a the bottom surface of the trench, and a vertical connector vertically extending with respect to a bottom surface of the trench and connecting the plurality of parallel connectors.

2. The socket of claim 1, wherein the socket includes an electrical signal path from the at least one probe to provide a communication path with the testing unit.

3. The socket of claim 2, wherein the connector protrudes from the housing at the sidewall of the trench.

4. The socket of claim 3, wherein the vertical connector comprises one of a blade and pin.

5. The socket of claim 3, wherein the connector comprises a metal bar connected between the vertical connectors with respectively different levels.

6. The socket of claim 1, further comprising the testing unit, the testing unit being in electrical communication with the connector and the probe.

7. The socket of claim 6, further comprising a connection between the testing unit and the connector configured to provide a direct signal path.

8. The socket of claim 6, wherein the testing unit is configured to provide test signals to the connector.

9. The socket of claim 6, wherein the testing unit is configured to provide test signals to the probe.

10. The socket of claim 6, wherein the testing unit is configured to provide test signals to the connector and the probe.

11. The socket of claim 1, further comprising the semiconductor package within the trench of the housing, wherein the connector electrically connects to the contact of the semiconductor package.

12. The socket of claim 11, wherein the connector connects first and second contacts exposed on a side of the semiconductor package.

13. The socket of claim 12, wherein the first contact is electrically connected to a probe of the socket by a first interconnection wiring of the semiconductor package.

14. The socket of claim 13, wherein the second contact is electrically connected to semiconductor chip within the semiconductor package by a second interconnection wiring of the semiconductor package.

15. The socket of claim 1, further comprising the semiconductor package within the trench of the housing, wherein the connector electrically connects to the contact of the semiconductor package to the probe by a first interconnection wiring of the semiconductor package.

16. The socket of claim 1, wherein the plurality of connectors have the same length.

* * * * *